(12) United States Patent
Choi et al.

(10) Patent No.: US 12,282,619 B2
(45) Date of Patent: Apr. 22, 2025

(54) TOUCH SENSOR HAVING DEVICE HOLE DEFINED BETWEEN SENSING ELECTRODES AND IMAGE DISPLAY DEVICE INCLUDING THE SAME

(71) Applicant: DONGWOO FINE-CHEM CO., LTD., Jeollabuk-do (KR)

(72) Inventors: Byung Jin Choi, Gyeonggi-do (KR); HwanSil Jang, Gyeonggi-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 0 days.

(21) Appl. No.: 18/679,952

(22) Filed: May 31, 2024

(65) Prior Publication Data

US 2024/0319811 A1    Sep. 26, 2024

Related U.S. Application Data

(63) Continuation of application No. 17/885,724, filed on Aug. 11, 2022, now Pat. No. 12,032,763, which is a
(Continued)

(30) Foreign Application Priority Data

Sep. 14, 2017    (KR) .......................... 10-2017-0117546

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0443* (2019.05); *G06F 3/0446* (2019.05);
(Continued)

(58) Field of Classification Search
CPC .... G06F 3/0412; G06F 3/0443; G06F 3/0446; G06F 3/047; G06F 3/0448;
(Continued)

(56) References Cited

U.S. PATENT DOCUMENTS 6,093,477 A * 7/2000 Matsufusa ............. H05K 3/363
428/209
2011/0310459 A1* 12/2011 Gates .................... G06F 3/0421
359/296
(Continued)

*Primary Examiner* — David D Davis
(74) *Attorney, Agent, or Firm* — The PL Law Group, PLLC

(57) ABSTRACT

A touch sensor includes a substrate layer, sensing electrodes on the substrate layer, and at least one device hole penetrating through one or more of the sensing electrodes. The device hole is superimposed over a functional device of an image display device such that the functional device is not positioned in the device hole. The sensing electrodes include first sensing electrodes arranged along a first direction to form a first sensing electrode row and second sensing electrodes arranged along a second direction to form a second sensing electrode column, the first and second directions being perpendicular to each other on the substrate layer. The device hole is defined by a space between a pair of the neighboring first sensing electrodes and a pair of the neighboring second sensing electrodes.

10 Claims, 7 Drawing Sheets

Related U.S. Application Data continuation of application No. 16/124,871, filed on Sep. 7, 2018, now Pat. No. 11,449,161.

(51) Int. Cl.
*G06F 3/047* (2006.01)
*G02F 1/1333* (2006.01)
*H10K 59/40* (2023.01)

(52) U.S. Cl.
CPC .......... *G06F 3/047* (2013.01); *G02F 1/13338* (2013.01); *G06F 3/0448* (2019.05); *G06F 2203/04111* (2013.01); *H10K 59/40* (2023.02)

(58) Field of Classification Search
CPC .......... G06F 2203/04111; G06F 3/041; G02F 1/13338; H10K 59/40
See application file for complete search history.

(56) References Cited

U.S. PATENT DOCUMENTS

| | | | |
|---|---|---|---|
| 2012/0217147 A1* | 8/2012 | Porter | G06F 3/0443 200/600 |
| 2014/0063407 A1* | 3/2014 | Kwon | G02F 1/1339 349/106 |
| 2016/0011633 A1* | 1/2016 | Watanabe | G02F 1/1333 345/184 |
| 2017/0147132 A1* | 5/2017 | Choi | G06F 3/0446 |
| 2017/0147133 A1* | 5/2017 | Choi | G06F 3/0446 |
| 2018/0089485 A1* | 3/2018 | Bok | G06F 3/0412 |

* cited by examiner

1st direction
⊗ ⟶ 2nd direction

1st direction
⊗ ⟶ 2nd direction

TOUCH SENSOR HAVING DEVICE HOLE DEFINED BETWEEN SENSING ELECTRODES AND IMAGE DISPLAY DEVICE INCLUDING THE SAME

CROSS-REFERENCE TO RELATED APPLICATION AND CLAIM OF PRIORITY

The present application is a continuation of U.S. patent application Ser. No. 17/885,724 filed Aug. 11, 2022, which is a continuation of U.S. patent application Ser. No. 16/124,871, filed Sep. 7, 2018, which claims priority to the benefit of Korean Patent Application No. 10-2017-0117546 filed on Sep. 14, 2017 in the Korean Intellectual Property Office (KIPO), the entire disclosure of which are incorporated by reference herein.

BACKGROUND

1. Field

The present invention relates to a touch sensor and an image display device including the same. More particularly, the present invention relates to a touch sensor including patterned sensing electrodes, and an image display device including the same.

2. Description of the Related Art

As information technologies are being developed, various demands in display devices having thinner dimension, light-weight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel or a touch sensor capable of inputting a user's direction by selecting an instruction displayed on a screen with a finger or an inputting tool is also developed. The touch panel or the touch sensor may be combined with the display device so that display and information input functions may be implemented in one electronic device.

The touch sensor may include a plurality of sensing electrodes for implementing a touch sensing. If the touch sensor is disposed toward a front face of the display device, a display image quality may be degraded by the sensing electrodes. Thus, a high transmittance and transparency may be required in the touch sensor.

Further, various functional devices (e.g., a camera, a speaker, a recorder, an optical sensor, a lighting device, etc.) may be combined with the display device, and desired functions from the functional devices may be hindered by the touch sensor.

Thus, development of the touch sensor having improved transmittance and optical properties while also having high sensitivity is required. For example, Korean Patent Publication No. 2014-0092366 discloses an image display device combined with a touch screen panel including a touch sensor. However, demands of a touch sensor or a touch panel with high resolution and improved optical properties are still increasing.

SUMMARY

According to an aspect of the present invention, there is provided a touch sensor having improved transmittance and device compatibility.

According to an aspect of the present invention, there is provided an image display device including a touch sensor having improved transmittance and device compatibility.

The above aspects of the present inventive concepts will be achieved by one or more of the following features or constructions:

A touch sensor includes a substrate layer, a plurality of sensing electrodes on the substrate layer, and a device hole penetrating through one or more of the sensing electrodes.

The device hole is formed in one sensing electrode selected from the sensing electrodes.

The touch sensor may further include an auxiliary conductive pattern contacting a surface of the sensing electrode in which the device hole is formed.

The sensing electrodes include first sensing electrodes arranged along a first direction and second sensing electrodes arranged along a second direction. The first and second directions are perpendicular to each other on the substrate layer. The auxiliary conductive pattern extends in the first direction provided that the auxiliary conductive pattern is formed on the first sensing electrode, and the auxiliary conductive pattern extends in the second direction provided that the auxiliary conductive pattern is formed on the second sensing electrode.

The auxiliary conductive pattern includes a plurality of auxiliary conductive patterns arranged around the device hole.

The sensing electrodes include first sensing electrodes arranged along a first direction and second sensing electrodes arranged along a second direction. The first and second directions are perpendicular to each other on the substrate layer. Intersection regions are defined at areas where the neighboring first sensing electrodes are connected to each other and the neighboring second sensing electrodes are connected to each other, and separation regions are defined at areas where the neighboring first sensing electrodes are isolated to each other and the neighboring second sensing electrodes are isolated to each other.

The touch sensor may further include connecting portions integrally connected to the first sensing electrodes at the intersection regions; and bridge electrodes connecting the second sensing electrodes at the intersection regions.

The device hole is formed in one intersection region selected from the intersection regions, wherein the connecting portion and the bridge electrode are omitted in the intersection region.

The touch sensor may further include a first bridge pattern electrically connecting the first sensing electrodes around the device hole; and a second bridge pattern electrically connecting the second sensing electrodes around the device hole.

The device hole is formed at one separation region selected from the separation regions.

The touch sensor may further include an auxiliary conductive pattern on a surface of the first sensing electrode or the second sensing electrode around the device hole.

The device hole penetrates through at least two sensing electrodes of the sensing electrodes.

A dummy region is defined between the sensing electrodes neighboring each other, and the device hole penetrates through a pair of the sensing electrodes adjacent to the dummy region.

The device hole also penetrates through the substrate layer.

The device hole corresponds to a functional device of an image display device which includes at least one of a camera, a speaker, a recorder, an optical sensor or a lighting device.

An image display device may include a display structure including at least one functional device selected from a camera, a speaker, a recorder, an optical sensor or a lighting device, and the touch sensor stacked on the display structure.

The device hole of the touch sensor is aligned to overlap the functional device.

The touch sensor according to exemplary embodiments as described above may include at least one device hole penetrating through a sensing electrode. The device hole may be formed to correspond to a functional device such as a camera, a speaker, an optical sensor, a recorder, a lighting device, etc., of an image display device. Thus, a desired operation of the functional device may be fully implemented without an interruption by the touch sensor.

In exemplary embodiments, a bridge pattern and/or an auxiliary conductive pattern may be formed based on a position of the device hole. Accordingly, a signal transfer blocking or a resistance increase by the device hole may be avoided.

DETAILED DESCRIPTION

According to exemplary embodiments of the present invention, there is provided a touch sensor which may comprise a plurality of sensing electrodes and at least one device hole. An image display device including the touch sensor and having improved optical and operational properties is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
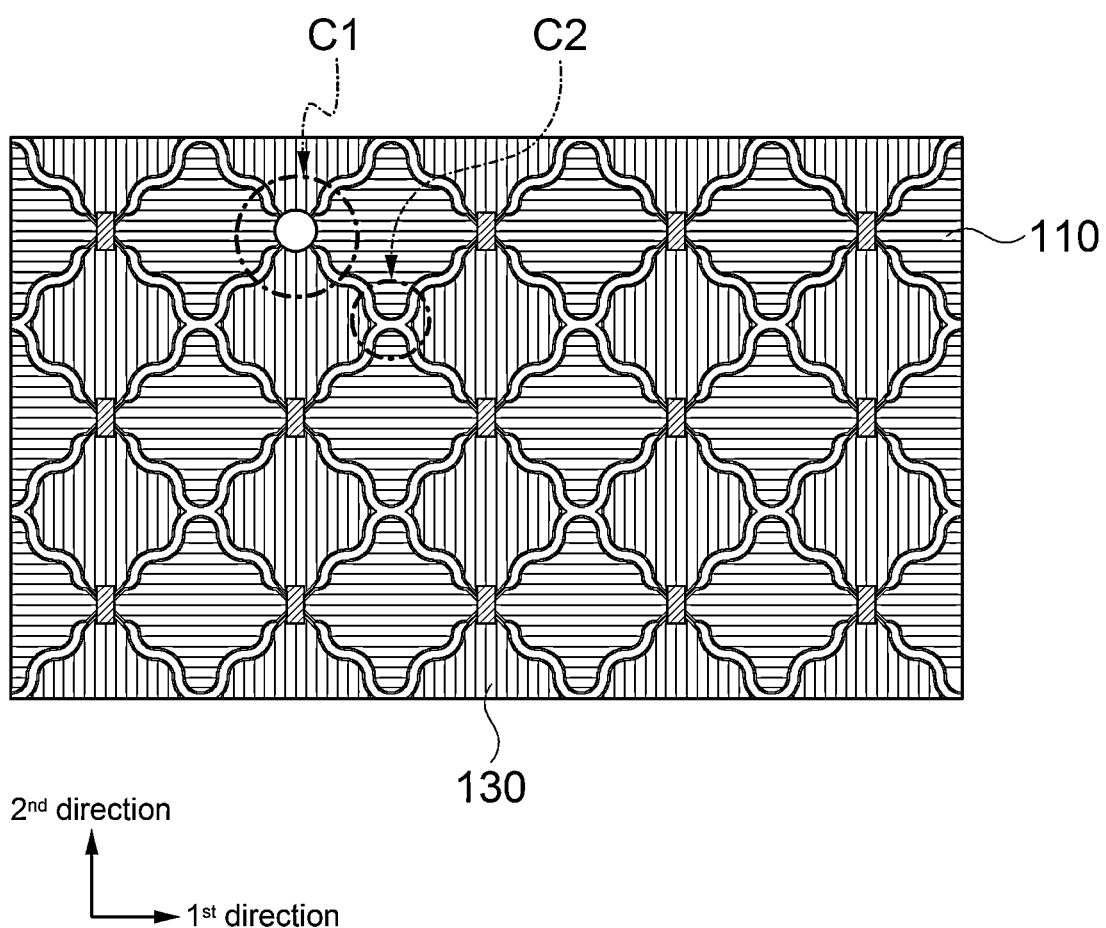
FIGS. 1 and 2 are schematic top plane views illustrating a touch sensor in accordance with exemplary embodiments.
Figure 2:
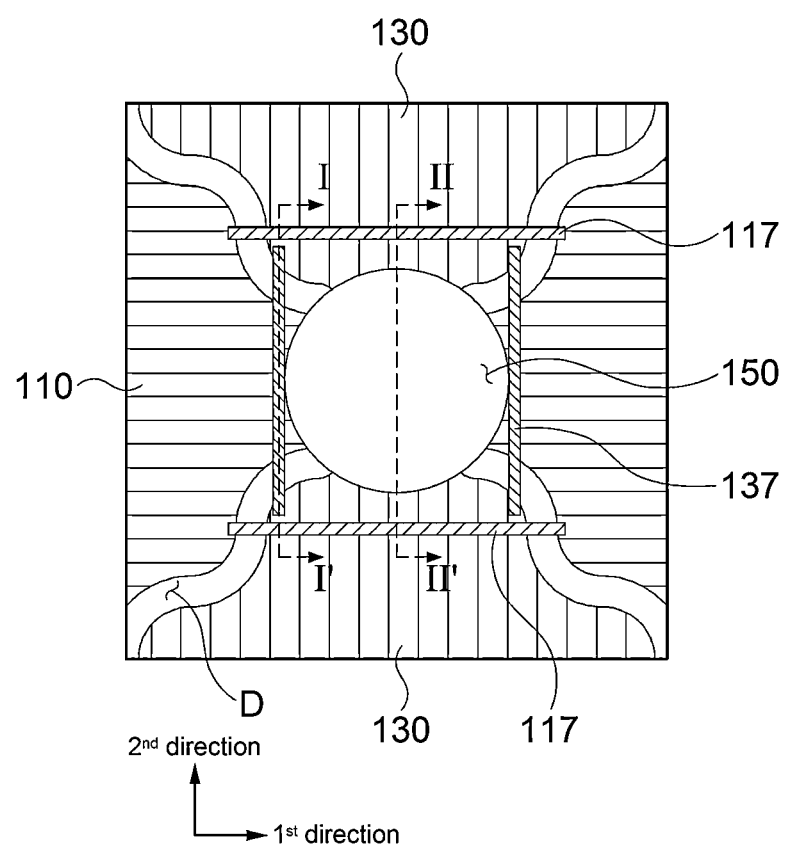

FIGS. 1 and 2 are schematic top plane views illustrating a touch sensor in accordance with exemplary embodiments. For example, FIG. 2 includes a partial enlarged view of a region designated as "C1" in FIG. 1.

Referring to FIGS. 1 and 2, the touch sensor may include a substrate layer 100 (see FIGS. 3 to 6) and sensing electrodes 110 and 130 arranged on the substrate layer 100.

The substrate layer 100 may include a film-type substrate that may serve as a base layer for forming the sensing electrodes 110 and 130, or an object or a workpiece on which the sensing electrodes 110 and 130 are formed. In some embodiments, the substrate layer 100 may include a display panel on which the sensing electrodes 110 and 130 may be directly formed.

For example, the substrate layer 100 may include a substrate or a film material commonly used in the touch sensor, e.g., glass, polymer and/or an inorganic insulation material. The polymer may include, e.g., cyclo olefin polymer (COP), polyethylene terephthalate (PET), polyacrylate (PAR), polyether imide (PEI), polyethylene naphthalate (PEN), polyphenylene sulfide (PPS), polyallylate (polyallylate), polyimide (PI), cellulose acetate propionate (CAP), polyether sulfone (PES), cellulose triacetate (TAC), polycarbonate (PC), cyclo olefin copolymer (COC), polymethylmethacrylate (PMMA), etc. The inorganic insulation material may include, e.g., silicon oxide, silicon nitride, silicon oxynitride, a metal oxide, etc.

The sensing electrodes 110 and 130 may include first sensing electrodes 110 and second sensing electrodes 130.

The first sensing electrodes 110 may be arranged along a first direction (e.g., an X-axis direction) that may be parallel to a top surface of the substrate layer 100. Accordingly, a first sensing electrode row extending in the first direction may be formed by the first sensing electrodes 110. Further, a plurality of the first sensing electrode rows may be arranged along a second direction.

Figure 7:
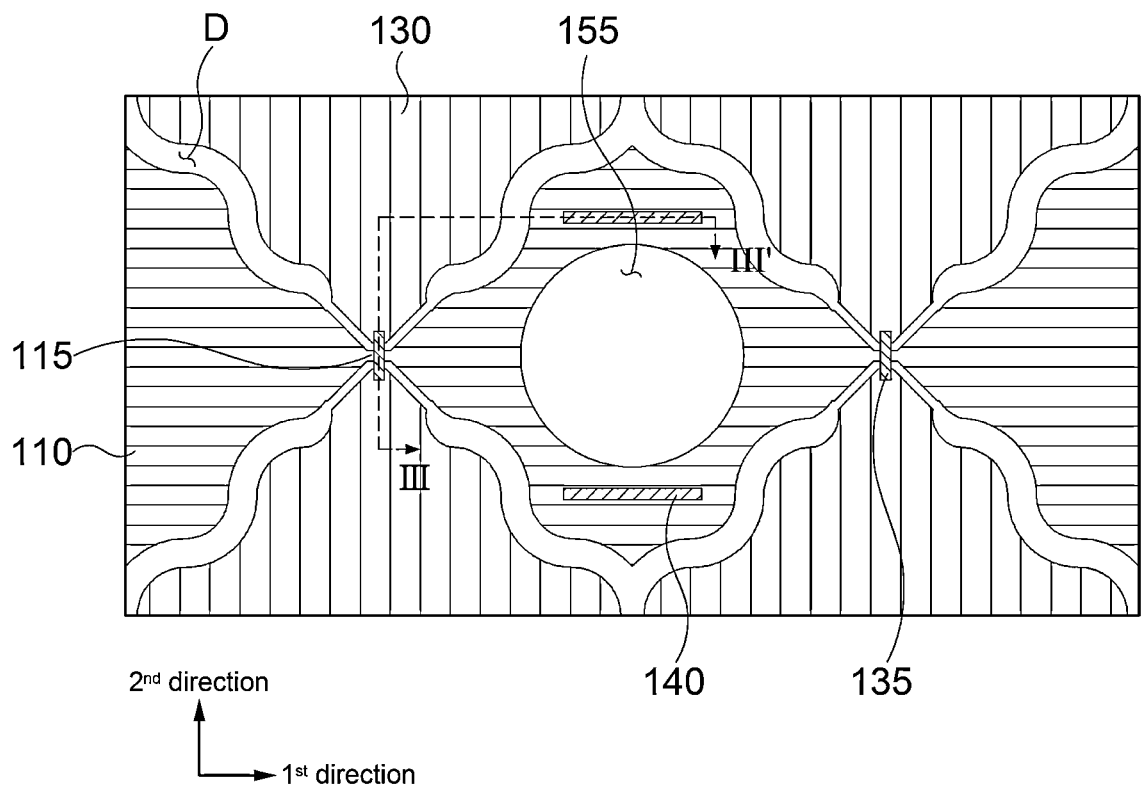
FIGS. 7 and 8 are a top plane view and a cross-sectional view, respectively, illustrating a touch sensor in accordance with some exemplary embodiments.

In some embodiments, the first sensing electrodes 110 neighboring in the first direction may be physically and electrically connected by a connecting portion 115 (see FIG. 7). For example, the connecting portion 115 may be integrally formed with the first sensing electrodes 110 at the same level.

The second sensing electrodes 130 may be arranged along the second direction (e.g., a Y-axis direction) that may be parallel to a top surface of the substrate layer 100. In some embodiments, the second sensing electrodes 130 may include island-type unit electrodes physically separated from each other. In this case, the second sensing electrodes 130 neighboring in the second direction may be electrically connected to each other by a bridge electrode 135 (see FIG. 7).

Accordingly, a second sensing electrode column extending in the second direction may be formed by a plurality of the second sensing electrodes 130. Further, a plurality of the second sensing electrode columns may be arranged along the first direction.

For example, the first and second directions may be perpendicular to each other and may be parallel to the top surface of the substrate layer 100.

In some embodiments, the first sensing electrode 110 and the second sensing electrode 130 may be patterned to have a boundary or periphery of a wavy shape. Accordingly, a moire phenomenon which may occur when the sensing electrodes 110 and 130, and electrodes or wirings (e.g., a data line, a gate line, etc.) in a display panel disposed under the touch sensor overlap each other may be avoided or reduced.

In some embodiments, the boundary or periphery of the first sensing electrode 110 and the second sensing electrode 130 may be patterned as a saw-tooth shape, a diamond shape, a polygonal shape, etc.

The sensing electrodes 110 and 130, and/or the bridge electrode 135 may include a metal, an alloy, a metal wire or a transparent conductive oxide.

For example, the sensing electrodes 110 and 130, and/or the bridge electrode 135 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn) or an alloy thereof (e.g., silver-palladium-copper (APC)). These may be used alone or in a combination thereof.

The sensing electrodes 110 and 130, and/or the bridge electrode 135 may include the transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the sensing electrodes 110 and 130, and/or the bridge electrode 135 may include a stack structure including the transparent conductive oxide and the metal. For example, the sensing electrodes 110 and 130, and/or the bridge electrode 135 may have a triple-layered structure including a transparent conductive oxide layer-a metal layer-a transparent conductive oxide layer. In this case, a flexible property may be enhanced by the metal layer, and a resistance may be reduced to increase a signal transfer speed. Further, an anti-corrosion property and a transmittance may be improved by the transparent conductive oxide layer.

A dummy region D may be defined between the first sensing electrode 110 and the second sensing electrode 130. The first sensing electrode 110 and the second sensing electrode 130 may be physically and electrically separated from each other by the dummy region D. Dummy electrodes (not illustrated) may be formed in the dummy region D. An electrode visibility in the dummy region D due to deviations of pattern arrangement and optical property may be reduced or avoided by the dummy electrodes.

In exemplary embodiments, the touch sensor may include a device hole 150 formed through the sensing electrode. The device hole 150 may penetrate through the first sensing electrode 110 and/or the second sensing electrode 130.

The device hole 150 may correspond to a functional device (e.g., such as a camera, a speaker, a recorder, an optical sensor, a lighting device, etc.) included in an image display device. For example, when the touch sensor is employed in the image display device, the device hole 150 may be aligned to overlap a position where the functional device is disposed.

For example, the device hole 150 may be formed in a region overlapping the camera so that a substantially 100% transmittance through the region may be obtained to improve a resolution or an image quality of the camera. Further, an optical and electrical interference by the sensing electrodes 110 and 130 included in the touch sensor may be substantially removed so that a desired operation of the functional device may be implemented in the image display device with a high reliability.

The term "device hole" used herein encompasses an opening formed by removing a conductive layer or defined by selectively not forming the conductive layer. The device hole may indicate a substantially vacant region and also may include an opening at least partially filled with a transparent insulation layer.

For example, after the formation of the sensing electrodes 110 and 130, a partial region of the sensing electrodes 110 and 130 may be etched by an additional mask to form the device hole 150.

In an embodiment, after the formation of a conductive layer forming the sensing electrodes 110 and 130, the conductive layer may be etched to simultaneously form the sensing electrodes 110 and 130, and the device hole 150.

In an embodiment, a circular mask may be used when forming the conductive layer for forming the sensing electrodes 110 and 130. In this case, the device hole 150 may be defined by a region at which the conductive layer may not be formed.

As illustrated in FIGS. 1 and 2, the device hole 150 may cover an intersection region of the first sensing electrode 110 and the second sensing electrode 130. In this case, the device hole 150 may be formed through four individual sensing electrodes 110 and 130 around the intersection region. For example, the device hole 150 may partially penetrate through a pair of the first sensing electrodes 110 neighboring in the first direction and a pair of the second sensing electrodes 130 neighboring in the second direction around the intersection region.

Figure 3:
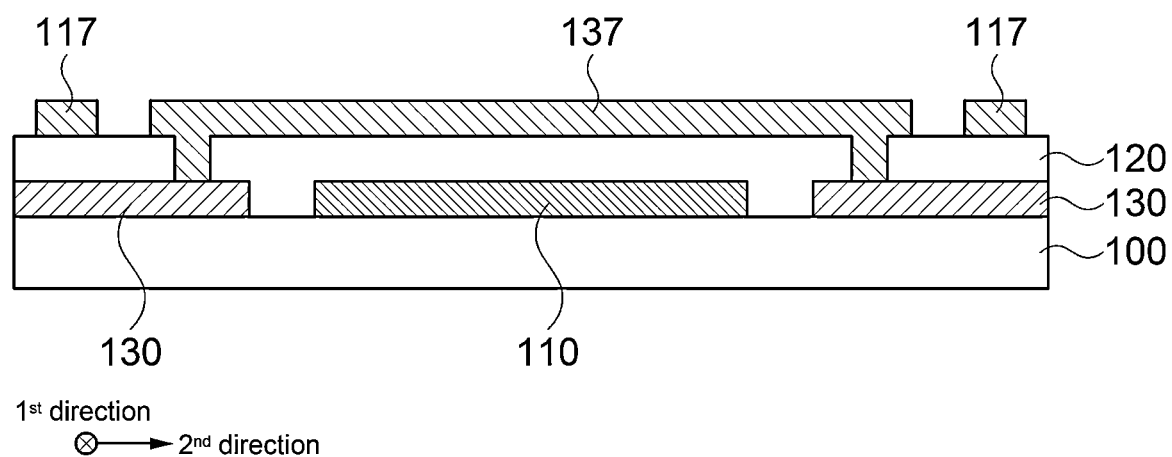
FIGS. 3 and 4 are schematic cross-sectional views illustrating a touch sensor in accordance with exemplary embodiments.
Figure 4:
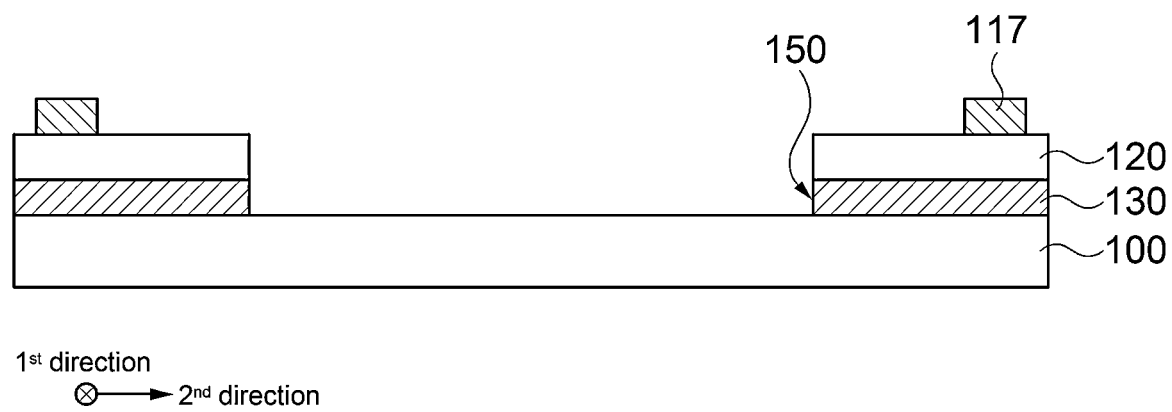

FIGS. 3 and 4 are schematic cross-sectional views illustrating a touch sensor in accordance with exemplary embodiments. Specifically, FIG. 3 is a cross-sectional view taken along a line I-I' of FIG. 2, and FIG. 4 is a cross-sectional view taken along a line II-II' of FIG. 2.

Referring to FIGS. 3 and 4 together with FIG. 2, when the device hole 150 is formed at the intersection region, the bridge electrode and the connecting portion as described above may not be formed at the intersection region or may be removed by the device hole 150. Thus, the first sensing electrodes 110 and the second sensing electrodes 130 may be separated from each other by the device hole 150.

In exemplary embodiments, a first bridge pattern 117 may be formed such that the first sensing electrodes 110 separated with respect to the device hole 150 may be electrically connected. Further, a second bridge pattern 137 may be formed such that the second sensing electrodes 130 separated with respect to the device hole 150 may be electrically connected.

In some embodiments, an insulation layer 120 at least partially covering the first and second sensing electrodes 110 and 130 may be formed, and the first and second bridge patterns 117 and 137 may be formed on the insulation layer 120.

As illustrated in FIG. 3, the second bridge pattern 137 may extend in the second direction, and may be connected to the second sensing electrodes 130 neighboring each other through contact holes formed in the insulation layer 120. The first bridge pattern 117 may extend in the first direction, and may be connected to the first sensing electrodes 110 neighboring each other through contact holes formed in the insulation layer 120.

In some embodiments, as illustrated in FIG. 2, two first bride patterns 117 and two second bridge patterns 137 may be disposed around the device hole 150. The first sensing electrodes 110 and the second sensing electrodes 130 may be connected by a pair of the first bridge patterns 117 and a pair of the second bridge patterns 137, respectively, around the device hole 150 so that uniformity of a current flow and a capacitance formation may be improved and a channel resistance may be decreased.

The insulation layer 120 may include an inorganic insulation material such as silicon oxide, silicon nitride, etc., or an organic insulation material such as acryl-based resin, a siloxane-based resin, etc. The bridge patterns 117 and 137 may include a metal and/or a transparent conductive oxide. For example, the bridge patterns 117 and 137 may include a conductive material substantially the same as or similar to that of the sensing electrodes 110 and 130.

In an embodiment, a passivation layer covering the insulation layer 120, the sensing electrodes 110 and 130, and the bridge patterns 117 and 137 may be further formed.

As illustrated in FIG. 4, the device hole 150 may penetrate through both the insulation layer 120 and the sensing electrodes 110 and 130. The top surface of the substrate layer 100 may be exposed by the device hole 150.

Figure 5:
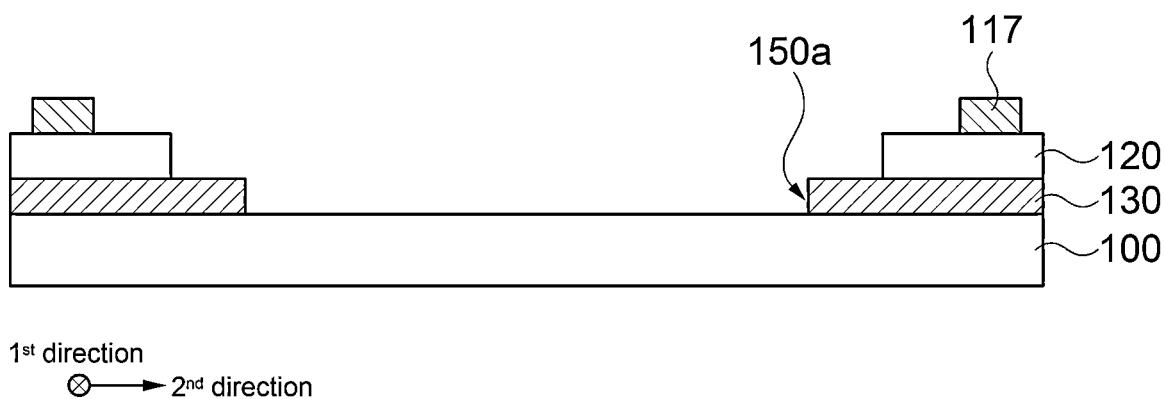
FIGS. 5 and 6 are schematic cross-sectional views illustrating a touch sensor in accordance with some exemplary embodiments.
Figure 6:
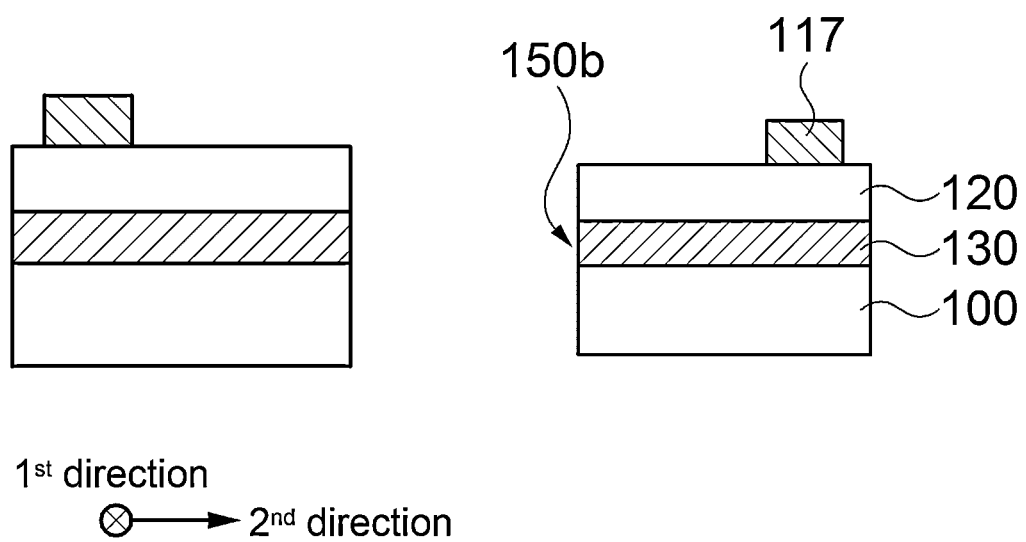

FIGS. 5 and 6 are schematic cross-sectional views illustrating a touch sensor in accordance with other exemplary embodiments.

Referring to FIG. 5, the insulation layer 120 may partially cover the sensing electrodes 110 and 130. In this case, a device hole 150a may include a stepped portion therein by the insulation layer 120.

Referring to FIG. 6, a device hole 150b may also penetrate a portion of the substrate layer 100 under the sensing electrodes 110 and 130. In this case, the device hole 150b may serve a through hole penetrating the insulation layer 120, the sensing electrodes 110 and 130 and the substrate layer 100.

A portion of the substrate layer 100 overlapping the above-mentioned functional device may be removed so that transmittance may be further enhanced.

Figure 8:
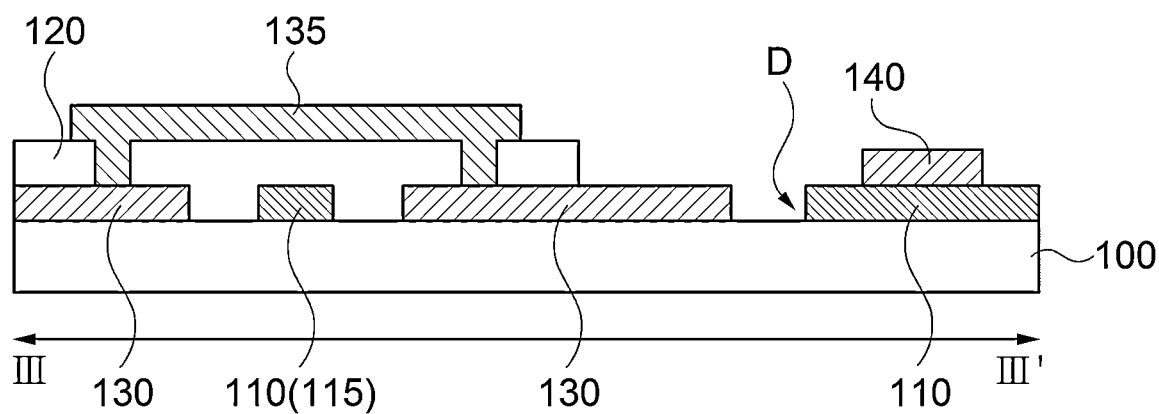

FIGS. 7 and 8 are a top plane view and a cross-sectional view, respectively, illustrating a touch sensor in accordance with some exemplary embodiments. Specifically, FIG. 8 is a cross-sectional view taken along a line III-III' of FIG. 7.

Referring to FIGS. 7 and 8, a device hole 155 may be formed in a single sensing electrode.

For example, as illustrated in FIG. 7, the device hole 155 may be formed in an inside of one first sensing electrode 110. In some embodiments, an auxiliary conductive pattern 140 may be formed on the sensing electrode (e.g., the first sensing electrode 110) in which the device hole 155 is formed.

An area or a volume for a current flow may be decreased in the first sensing electrode 110 including the device hole 155 therein. In some embodiments, the reduced area or volume may be compensated by the auxiliary conductive pattern 140 so that a channel resistance may be also reduced. Thus, an excessive increase or deviation of the channel resistance in the sensing electrode including the device hole 155 may be prevented.

As illustrated in FIG. 8, the auxiliary conductive pattern 140 may directly contact the first sensing electrode 110. In some embodiments, the auxiliary conductive pattern 140 may be formed from a conductive layer the same as that for the bridge electrode 135 by the same etching process.

As illustrated in FIG. 7, a plurality of the auxiliary conductive patterns 140 may be formed. For example, at least two auxiliary conductive patterns 140 may be arranged around the device hole 155.

In some embodiments, the sensing electrodes 110 and 130 may include a mesh structure or a slit structure therein, and may include a plurality of electrode lines.

For example, the first sensing electrode 110 may include first electrode lines extending in the first direction therein, and the second sensing electrode 130 may include second sensing electrode lines extending in the second direction therein.

The auxiliary conductive pattern 140 may have a bar shape extending in a direction the same as that of the electrode line. For example, if the device hole 155 is formed in the first sensing electrode 110, the auxiliary conductive pattern 140 may extend in the first direction together with the first electrode line. If the device hole 155 is formed in the second sensing electrode 130, the auxiliary conductive pattern 140 may extend in the second direction together with the second electrode line.

In some embodiments, the electrode lines included in the sensing electrodes 110 and 130 may extend in a zigzag shape or a wavy shape. In this case, the auxiliary conductive pattern 140 may be patterned as the zigzag shape or the wavy shape substantially the same as that of the electrode lines.

In some embodiments, the auxiliary conductive pattern 140 may be inclined with respect to a pixel electrode of a display panel on which the touch sensor is formed. Accordingly, a moire phenomenon occurring when boundaries of conductive patterns overlap to be parallel to each other may be avoided or reduced.

Figure 9:
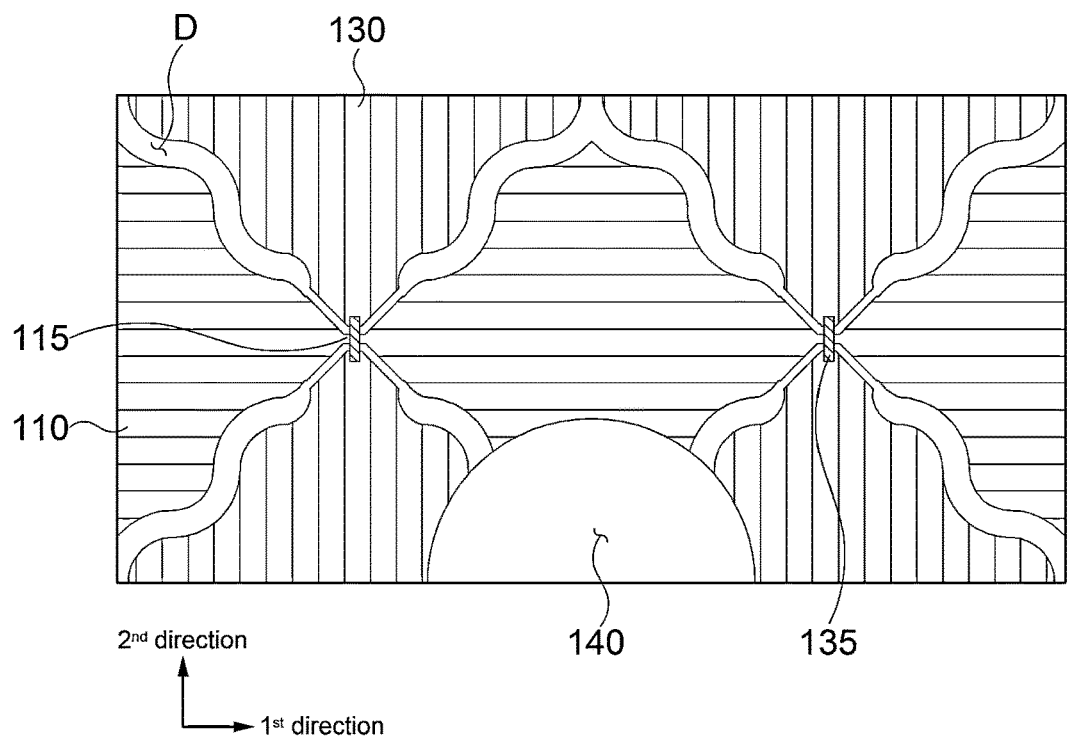
FIG. 9 is a top plane view illustrating a touch sensor in accordance with some exemplary embodiments.

FIG. 9 is a top plane view illustrating a touch sensor in accordance with some exemplary embodiments.

Referring to FIG. 9, a device hole 160 may be formed through a plurality of the sensing electrodes 110 and 130. In some embodiments, the device hole 160 may be formed in the region designated as "C2" in FIG. 1. In this case, the device hole 160 may penetrate through four sensing electrodes 110 and 130 located around the region C2.

For example, the region C2 may correspond to a separation region at which the first sensing electrodes 110 and the second sensing electrodes 130 neighboring each other may be isolated from each other. If the device hole 160 is formed to cover the separation region, the bridge patterns 117 and 137 illustrated in FIG. 2 may be omitted.

In an embodiment, as illustrated in FIG. 7, an auxiliary conductive pattern may be further formed to prevent a resistance increase around the device hole 160. For example, the auxiliary conductive pattern may be formed on surfaces of the first sensing electrode 110 and/or the second sensing electrode 130 around the device hole 160.

Figure 10:
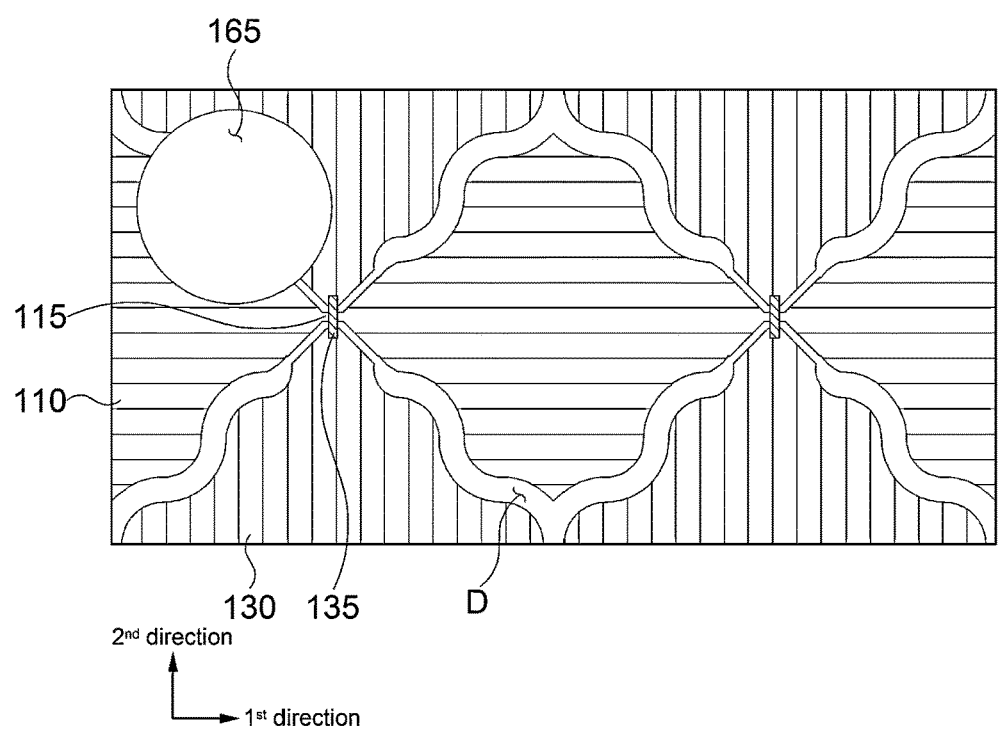
FIG. 10 is a top plane view illustrating a touch sensor in accordance with some exemplary embodiments.

FIG. 10 is a top plane view illustrating a touch sensor in accordance with some exemplary embodiments.

Referring to FIG. 10, a device hole 165 may penetrate through the first sensing electrode 110 and the second sensing electrode 130 neighboring each other with respect to a dummy region D. In this case, a pair of the first sensing electrode 110 and the second sensing electrode 130 may be penetrated together by one device hole 165.

Figure 11:
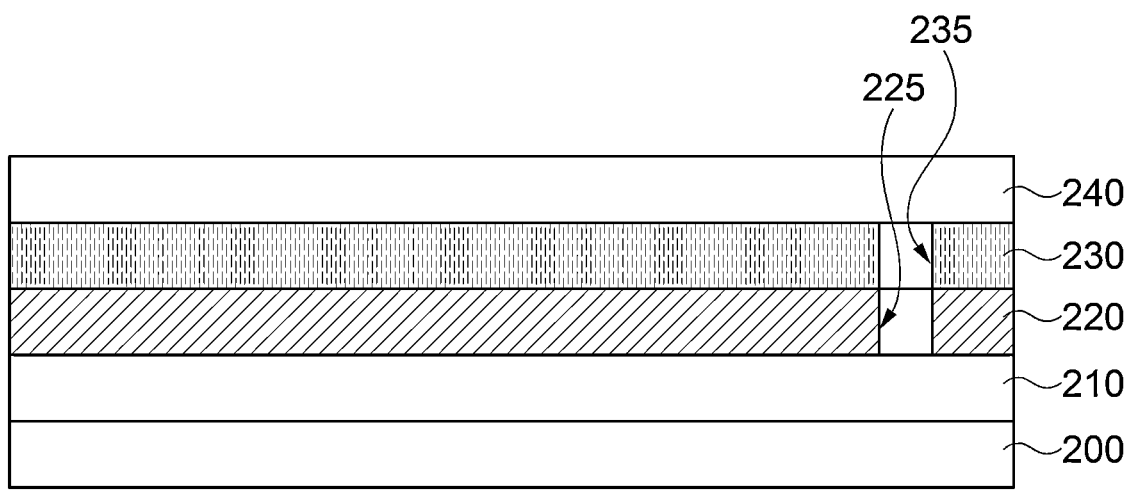
FIG. 11 is a cross-sectional view illustrating an image display device in accordance with exemplary embodiments.

FIG. 11 is a cross-sectional view illustrating an image display device in accordance with exemplary embodiments.

Referring to FIG. 11, the image display device may include a base substrate 200, a display structure 210, a touch sensor 220, a polarizing plate 230 and a window 240. A display panel may be defined by the base substrate 200 and the display structure 210.

The base substrate 200 may serve as, e.g., a back-plane substrate of the image display device, and may include glass or a transparent insulation material such as polyimide.

The display structure 210 may include thin film transistors (TFTs) arranged on the base substrate 200, a pixel electrode electrically connected to the TFT, and a display layer formed on the pixel electrode. The display layer may include, e.g., a liquid crystal layer or an organic light emitting layer. The display structure 210 may further include wirings such as a data line, a power line, a scan line, etc., which may be electrically connected to the TFTs. Additionally, functional devices such as a camera, a speaker, a recorder, an optical sensor, a lighting device, etc., may be included in the display structure 210.

The touch sensor 220 may be disposed on the display structure 220. The touch sensor may include a first device hole 225, and the first device hole 225 may be aligned to substantially overlap the functional device.

The polarizing plate 230 may be disposed on the touch sensor 220. In some embodiments, the polarizing plate 230 may also include a second device hole overlapping the functional device.

The first and second device holes 225 and 235 may be aligned to overlap each other. The first and second device holes 225 and 235 are individually depicted in FIG. 11, however, may be substantially merged with each other.

In some embodiments, the polarizing plate 230 may be stacked on the display structure 210, and then the touch sensor 220 may be stacked on the polarizing plate 230.

The window 240 may be formed on the polarizing plate 230 or the touch sensor 220, and may serve as a protective film or a protective substrate. The window 240 May include, e.g., a transparent insulation resin such as polyester, polyurethane, polyacrylate, etc.

What is claimed is:

1. A touch sensor comprising:
   a substrate layer;
   a plurality of sensing electrodes on the substrate layer; and
   at least one device hole penetrating through one or more of the sensing electrodes,
   wherein the at least one device hole is configured to be superimposed over a functional device of an image display device which includes at least one of a camera, a speaker, a recorder, an optical sensor, and a lighting device such that the functional device is not positioned in the device hole;
   the sensing electrodes include first sensing electrodes arranged along a first direction to form a first sensing electrode row and second sensing electrodes arranged along a second direction to form a second sensing electrode column, the first and second directions being perpendicular to each other on the substrate layer; and
   the device hole is defined by a space between a pair of the neighboring first sensing electrodes and a pair of the neighboring second sensing electrodes.

2. The touch sensor according to claim 1, wherein intersection regions are defined at areas where the neighboring first sensing electrodes are connected to each other and the neighboring second sensing electrodes are connected to each other, and
   separation regions are defined at areas where the neighboring first sensing electrodes are isolated to each other and the neighboring second sensing electrodes are isolated to each other.

3. The touch sensor according to claim 2, wherein the device hole is formed in one separation region of the separation regions.

4. The touch sensor according to claim 2, further comprising:
   connecting portions integrally connected to the first sensing electrodes at the intersection regions to connect the neighboring first sensing electrodes each other; and
   bridge electrodes connecting the second sensing electrodes to each other at the intersection regions.

5. The touch sensor according to claim 1, further comprising an auxiliary conductive pattern contacting a top surface of the sensing electrode in which the device hole is formed.

6. The touch sensor according to claim 1, wherein the auxiliary conductive pattern includes a plurality of auxiliary conductive patterns arranged around the device hole.

7. The touch sensor according to claim 1, wherein a dummy region is defined between the sensing electrodes neighboring each other; and
   the device hole penetrates through a pair of the sensing electrodes adjacent to the dummy region.

8. The touch sensor according to claim 1, wherein the device hole further penetrates through the substrate layer.

9. An image display device, comprising:
   a display structure including at least one functional device selected from the group consisting of a camera, a speaker, a recorder, an optical sensor, and a lighting device; and
   a touch sensor according to claim 1 stacked on the display structure.

10. The image display device according to claim 9, wherein the device hole of the touch sensor is aligned to overlap the functional device.

* * * * *